United States Patent
Huddar et al.

(10) Patent No.: US 10,243,560 B2
(45) Date of Patent: Mar. 26, 2019

(54) MAINTAINING SLEW RATE WHILE LOADING FLASH MEMORY DIES

(71) Applicant: SEAGATE TECHNOLOGY LLC, Cupertino, CA (US)

(72) Inventors: Vinod Arjun Huddar, Karnataka (IN); Abhishek Laguvaram, Telangana (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/675,010

(22) Filed: Aug. 11, 2017

(65) Prior Publication Data
US 2019/0052270 A1  Feb. 14, 2019

(51) Int. Cl.
| | |
|---|---|
| G11C 16/06 | (2006.01) |
| H03K 19/003 | (2006.01) |
| H03K 19/094 | (2006.01) |
| G06F 13/40 | (2006.01) |
| G11C 16/34 | (2006.01) |
| G06F 3/00 | (2006.01) |

(52) U.S. Cl.
CPC ... *H03K 19/00346* (2013.01); *G06F 13/4068* (2013.01); *G11C 16/06* (2013.01); *G11C 16/3418* (2013.01); *H03K 19/094* (2013.01); *G06F 3/00* (2013.01)

(58) Field of Classification Search
CPC ......... G11C 16/3418; H03K 19/00346; H03K 19/094; G06F 13/0468
USPC ............ 365/185.17, 185.11, 185.33, 185.28, 365/189.97
See application file for complete search history.

(56) References Cited

U.S. PATENT DOCUMENTS

| | | | | |
|---|---|---|---|---|
| 5,596,532 | A | * 1/1997 | Cernea | G11O 5/145 365/185.18 |
| 6,005,412 | A | 12/1999 | Ranjan et al. | |
| 2005/0259504 | A1 | * 11/2005 | Murtugh | G11C 7/22 365/233.1 |
| 2017/0011784 | A1 | * 1/2017 | Berge | G06F 13/1605 |

OTHER PUBLICATIONS

Altera, White Paper, "Input Signal Edge Rate Guidance," Jun. 2005, ver. 1.0, two (2) pages.
Texas Instruments, "Dual 2-Input NAND Gate With Schmitt-Trigger Inputs," Product Folder Links: SN74LVC2G132, SCES5470—Feb. 2004—Revised Dec. 2013, 20 pages.

* cited by examiner

*Primary Examiner* — Tan T. Nguyen
(74) *Attorney, Agent, or Firm* — Holland & Hart

(57) ABSTRACT

Systems and methods for maintaining a slew rate while loading flash memory dies are described. In one embodiment, the systems and methods may include placing one or more comparator circuits connectively between one or more channel controllers and a plurality of flash memory dies and maintaining a slew rate in relation to the one or more channel controllers writing data to a plurality of flash memory dies inside the solid state drive. In some cases, a hardware controller of a solid state drive may include the one or more channel controllers. In some cases, the plurality of flash memory dies may include at least one NAND die.

20 Claims, 6 Drawing Sheets

MAINTAINING SLEW RATE WHILE LOADING FLASH MEMORY DIES

SUMMARY

The present disclosure is directed to methods and systems for maintaining a slew rate while loading flash memory dies. In some embodiments, the present systems and methods may implement one or more comparator circuits to maintain the slew rate when writing data to a relatively high number of flash memory dies in a storage drive such as a solid state storage device.

A storage system for maintaining a slew rate while loading flash memory dies is described. In one embodiment, the storage system device may include a storage drive. In some embodiments, the storage drive may include a hardware controller and a plurality of flash memory dies. In some cases, the hardware controller may include one or more channel controllers. In some embodiments the storage drive may include one or more comparator circuits configured to maintain a slew rate in relation to the one or more channel controllers writing data to the plurality of flash memory dies. In some cases, the one or more comparator circuits may be placed connectively between the one or more channel controllers and the plurality of flash memory dies. In some cases, the one or more comparator circuits may include at least one of an inverting comparator, a non-inverting comparator, and a differential amplifier, or any combination thereof. In some cases, the plurality of flash memory dies include at least one NAND die.

In one embodiment, the hardware controller may include a first channel controller to drive a first set of flash memory dies from the plurality of flash memory dies and a second channel controller to drive a second set of flash memory dies from the plurality of flash memory dies. In some cases, the first set of flash memory dies or the second set of flash memory dies, or both, may include at least 32 flash memory dies.

In some embodiments, an input of at least one of the one or more comparator circuits electrically connects to the first channel controller and an output of the at least one comparator circuit electrically connects to the first set of flash memory dies. In some cases, a distance of an electrical connection between the at least one comparator circuit and the first set of flash memory dies may be relatively shorter than a distance of an electrical connection between the at least one comparator circuit and the first channel controller.

In some embodiments, the output of the at least one comparator circuit enables the first channel controller to provide the first set of flash memory dies a data signal with a slew rate of at least 0.3 volts per nanosecond. In some cases, a first write channel may be routed between the first channel controller and the first set of flash memory dies to enable the first channel controller to write data to the first set of flash memory dies. In some cases, a first read channel may be routed between the first channel controller and the first set of flash memory dies to enable the first channel controller to read data from the first set of flash memory dies. In some cases, the first read channel may be separate from the first write channel.

In some embodiments, a second write channel may be routed between the second channel controller and the second set of flash memory dies, wherein the first write channel and the second write channel each include one or more data lines, and wherein each data line of the first write channel and each data line of the second write channel is electrically connected to at least one of the one or more comparator circuits.

An apparatus for maintaining a slew rate while loading flash memory dies is also described. In one embodiment, the apparatus may include a processor, memory in electronic communication with the processor, and instructions stored in the memory, the instructions being executable by the processor to perform the steps of placing one or more comparator circuits connectively between one or more channel controllers and a plurality of flash memory dies and maintaining a slew rate in relation to the one or more channel controllers writing data to a plurality of flash memory dies inside the solid state drive. In some cases, a hardware controller of a solid state drive may include the one or more channel controllers. In some cases, the plurality of flash memory dies may include at least one NAND die.

A method for maintaining a slew rate while loading flash memory dies is also described. In one embodiment, the method may include placing one or more comparator circuits connectively between one or more channel controllers and a plurality of flash memory dies and maintaining a slew rate in relation to the one or more channel controllers writing data to a plurality of flash memory dies inside the solid state drive. In some cases, a hardware controller of a solid state drive may include the one or more channel controllers. In some cases, the plurality of flash memory dies may include at least one NAND die.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

DETAILED DESCRIPTION

Figure 1:
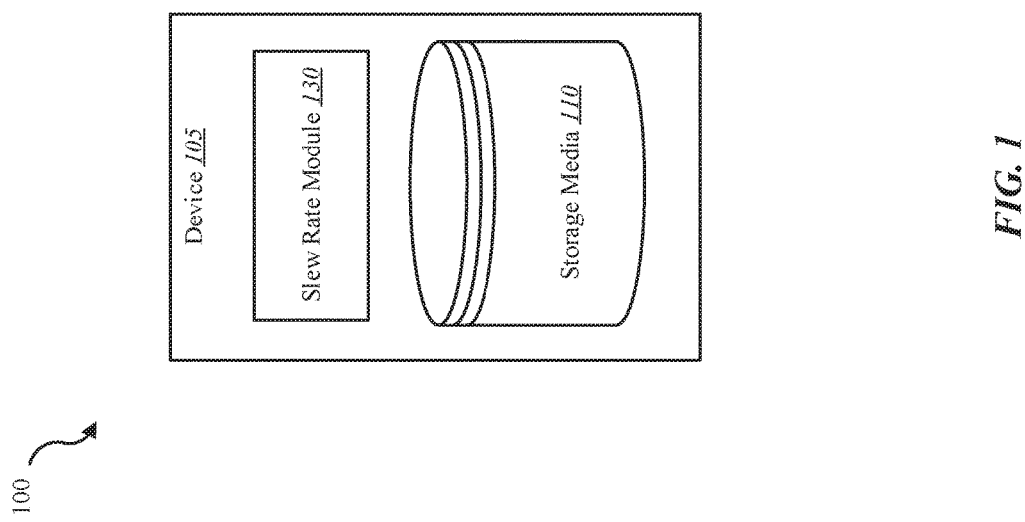
FIG. 1 is a block diagram of an example of a system in accordance with various embodiments.

The following relates generally to maintaining a slew rate while loading flash memory dies. In one embodiment, the present systems and methods relates generally to a solid state storage device such as a solid state drive (SSD), solid state card, solid state module, etc. High capacity solid state storage devices with capacities such as 30 terabyte (TB), 60 TB, 100 TB, or higher, may use a relatively high count of NAND dies to achieve such capacities. However, using a relatively high count of NAND dies than is typically used in a conventional storage drive may cause a limitation on a storage drive controller's capability of driving or loading data onto the NANDs during write cycles. This is due at least in part to the relatively high count of NAND dies causing the controller to see a significantly higher than normal capacitive load during write cycles.

In some embodiments, one or more NAND dies may be packaged together in a single NAND chip. In some cases, each NAND chip may include one or more NAND receivers or NAND registers configured to receive a predetermined number of bits of data to be stored on the one or more NAND dies. In some embodiments, a NAND receiver may have a constraint on minimum slew rate for incoming data. As one example, a NAND receiver may have a minimum slew rate of 0.3 Volts per nanosecond. When signal slew rate is slower than the minimum slew rate, the NAND receiver may not work reliably. For example, input signals slower than the minimum slew rate may cause increased jitter (internally), double clocking, or excessive power consumption, or any combination thereof.

While a conventional controller may drive up to 4 to 8 dies, a controller of the present systems and methods may be configured to drive 32, 48, 64, 128, or more dies while maintaining the same read/write performance of a conventional controller. Without the present systems and methods, a conventional system would be incapable of driving such a high NAND load. However, a NAND controller of the present systems and methods may be configured to drive a relatively high NAND load or relatively high number of NAND dies such as 32 dies, 48 dies, 64 dies, or 128 dies while maintaining a specified minimum slew rate of one or more respective NAND receivers.

In one embodiment, the present systems and methods may place one or more comparator circuits on a signal path of a NAND receiver to maintain a specified minimum slew rate of one or more respective NAND receivers while driving a relatively high number of NAND dies. In some embodiments, the comparator circuits may be configured to remove noise effects on a slow rising signal received by a NAND receiver. In some cases, the present systems and methods enable a storage drive manufacturer to add more dies per channel, thus increasing the storage capacity of a storage drive. A drive of the present systems and methods may be manufactured with a 3.5-inch storage drive enclosure, 2.5-inch storage drive enclosure, 1.8-inch storage drive enclosure, a peripheral component interconnect express (PCIe) solid state card, a PCIe mini card, a solid state module, a M.2 card, a U.2 card, or any combination thereof. In some cases, a connector of a storage drive of the present systems and methods may be based at least in part on at least one of serial advanced technology attachment (SATA) connector, mini SATA (mSATA) connector, SATA Express connector, small computer system interface (SCSI) connector, serially attached SCSI (SAS) connector, PCIe connector, M.2 connector, U.2 connector, non-volatile memory express (NVMe) connector, or any combination thereof.

In one embodiment, a comparator circuit of the present systems and methods may be placed on a printed circuit board (PCB) of a storage drive. In some cases, the comparator circuit may be placed on the PCB between or in a signal path between a driver of a channel controller and a NAND receiver. When a channel controller is driving data such as when a storage drive performs a write operation to NAND dies, an input of the comparator circuit may be connected to an output of the channel controller and an output of the comparator circuit may be an input of one or more NAND dies. When a NAND die is driving data such as when a storage drive performs a read operation from NAND dies, an input of the comparator circuit may be a NAND die output and an output of the comparator circuit may be an input of the channel controller.

In some cases, a connection between a channel controller and the respective channel of NAND dies may include a data bus with two or more data lines. In one embodiment, one or more comparator circuits may be electrically connected to the data bus between a channel connector and a NAND die. In some cases, each data line of the data bus may be electrically connected to a comparator circuit. For example, 16 comparator circuits may be connected to a 16-bit data bus, one comparator circuit for each of the 16 data lines.

In some cases, the present systems and methods may use a bidirectional data bus to accommodate both read operations and write operations. In some embodiments, one or more lines of a bidirectional data bus may be electrically connected to a bidirectional comparator circuit. In some embodiments, the present systems and methods may use separate channels for read and write operations. When a storage drive is configured with one or more read channels separate from one or more write channels, the present systems and methods may place one or more comparator circuits on the one or more write channels and bypass placing any comparator circuits on the one or more read channels.

In one embodiment, a comparator circuit may be placed as close as possible to a NAND die to realize a maximum data rate. When a comparator circuit is placed relatively far from the NAND die and closer to a channel controller, the comparator circuit has to drive a data signal on a relatively long PCB trace in addition to driving the respective NAND dies. PCB traces are capacitive, hence the additional capacitance of a PCB trace may lower the data rate that can be achieved during a write operation when the comparator circuit is placed relatively far from the NAND die. On the other hand, a read operation is not an issue with respect to comparator circuit placement as a single NAND die is the total capacitive load a channel controller experiences during a read operation.

FIG. 1 is a block diagram illustrating one embodiment of an environment 100 in which the present systems and methods may be implemented. The environment may include device 105 and storage media 110. The storage media 110 may include any combination of hard disk drives, solid state drives, and hybrid drives that include both hard disk and solid state drives. In some embodiments, the storage media 110 may include shingled magnetic recording (SMR) storage drives. In some embodiments, the systems and methods described herein may be performed on a single device such as device 105. In some cases, the methods described herein may be performed on multiple storage devices or a network of storage devices such as a cloud storage system and/or a distributed storage system. Examples of device 105 include a storage server, a storage enclosure, a storage controller, storage drives in a distributed storage system, storage drives on a cloud storage system, storage devices on personal computing devices, storage devices on a server, or any combination thereof. In some configurations, device 105 may include slew rate module 130. In one example, the device 105 may be coupled to storage media 110. In some embodiments, device 105 and storage media 110 may be components of flash memory or a solid state drive and/or another type of storage drive. Alternatively, device 105 may be a component of a host of the storage media 110 such as an operating system, host hardware system, or any combination thereof.

In one embodiment, device 105 may be a computing device with one or more processors, memory, and/or one or more storage devices. In some cases, device 105 may include a wireless storage device. In some embodiments, device 105 may include a cloud drive for a home or office setting. In one embodiment, device 105 may include a network device such as a switch, router, access point, or any combination thereof. In one example, device 105 may be operable to receive data streams, store and/or process data, and/or transmit data from, to, or in conjunction with one or more local and/or remote computing devices.

The device 105 may include a database. In some cases, the database may be internal to device 105. In some embodiments, storage media 110 may include a database. Additionally, or alternatively, the database may include a connection to a wired and/or a wireless database. Additionally, as described in further detail herein, software and/or firmware (for example, stored in memory) may be executed on a processor of device 105. Such software and/or firmware executed on the processor may be operable to cause the device 105 to monitor, process, summarize, present, and/or send a signal associated with the operations described herein.

In some embodiments, storage media 110 may connect to device 105 via one or more networks. Examples of networks include cloud networks, local area networks (LAN), wide area networks (WAN), virtual private networks (VPN), a personal area network, near-field communication (NFC), a telecommunications network, wireless networks (using 802.11, for example), and cellular networks (using 3G and/or LTE, for example), or any combination thereof. In some configurations, the network may include the Internet and/or an intranet. The device 105 may receive and/or send signals over a network via a wireless communication link. In some embodiments, a user may access the functions of device 105 via a local computing device, remote computing device, and/or network device. For example, in some embodiments, device 105 may include an application that interfaces with a user. In some cases, device 105 may include an application that interfaces with one or more functions of a network device, remote computing device, and/or local computing device.

In one embodiment, the storage media 110 may be internal to device 105. As one example, device 105 may include a storage controller that interfaces with storage media of storage media 110. Slew rate module 130 may place one or more comparator circuits connectively between the predetermined number of flash memory dies and one or more channel controllers in a storage drive. Further details regarding the slew rate module 130 are provided below.

Figure 2:
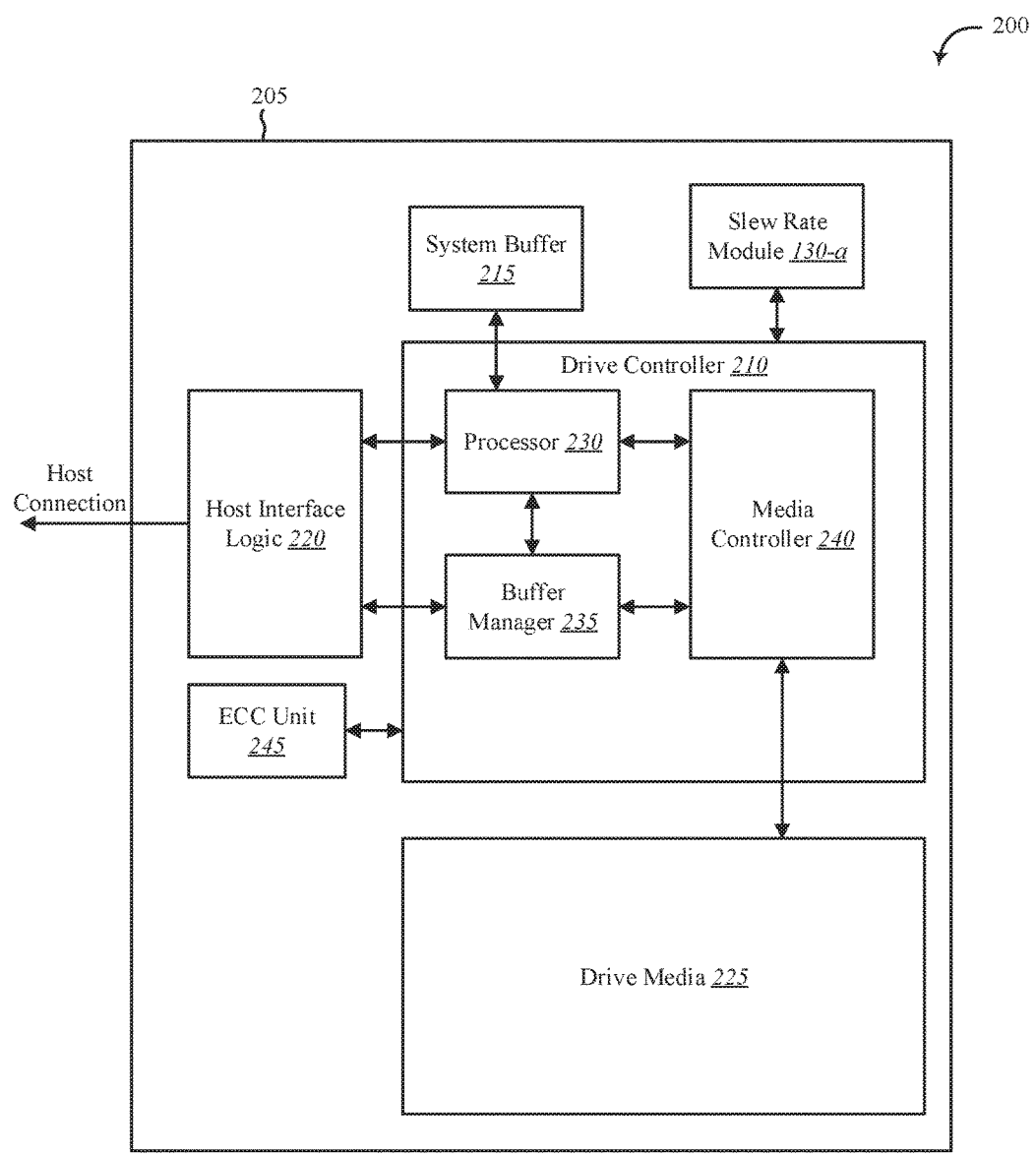
FIG. 2 shows a block diagram of a device in accordance with various aspects of this disclosure.

FIG. 2 shows a block diagram 200 of an apparatus 205 for use in electronic communication, in accordance with various aspects of this disclosure. The apparatus 205 may be an example of one or more aspects of device 105 described with reference to FIG. 1. The apparatus 205 may include a drive controller 210, system buffer 215, host interface logic 220, drive media 225, and slew rate module 130-a. Each of these components may be in communication with each other and/or other components directly and/or indirectly.

One or more of the components of the apparatus 205, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used such as Structured/Platform ASICs, Field Programmable Gate Arrays (FPGAs), and other Semi-Custom ICs, which may be programmed in any manner known in the art. The functions of each module may also be implemented, in whole or in part, with instructions embodied in memory formatted to be executed by one or more general and/or application-specific processors.

In one embodiment, the drive controller 210 may include a processor 230, a buffer manager 235, and a media controller 240. The drive controller 210 may process, via processor 230, read and write requests in conjunction with the host interface logic 220, the interface between the apparatus 205 and the host of apparatus 205. The system buffer 215 may hold data temporarily for internal operations of apparatus 205. For example, a host may send data to apparatus 205 with a request to store the data on the drive media 225. Drive media 225 may include one or more disk platters, flash memory, any other form of non-volatile memory, or any combination thereof. The driver controller 210 may process the request and store the received data in the drive media 225. In some cases, a portion of data stored in the drive media 225 may be copied to the system buffer 215 and the processor 230 may process or modify this copy of data and/or perform an operation in relation to this copy of data held temporarily in the system buffer 215. In some cases, ECC unit 245 may perform error correction on data stored in drive media 225.

In some embodiments, slew rate module 130-a may include at least one of one or more processors, one or more memory devices, one or more storage devices, instructions executable by one or more processors stored in one or more memory devices and/or storage devices, or any combination thereof. Although depicted outside of drive controller 210, in some embodiments, slew rate module 130-a may include software, firmware, and/or hardware located within drive controller 210 and/or operated in conjunction with drive controller 210. For example, slew rate module 130-a may include at least a portion of processor 230, buffer manager 235, and/or media controller 240. In one example, slew rate module 130-a may include one or more instructions executed by processor 230, buffer manager 235, and/or media controller 240.

Figure 3:
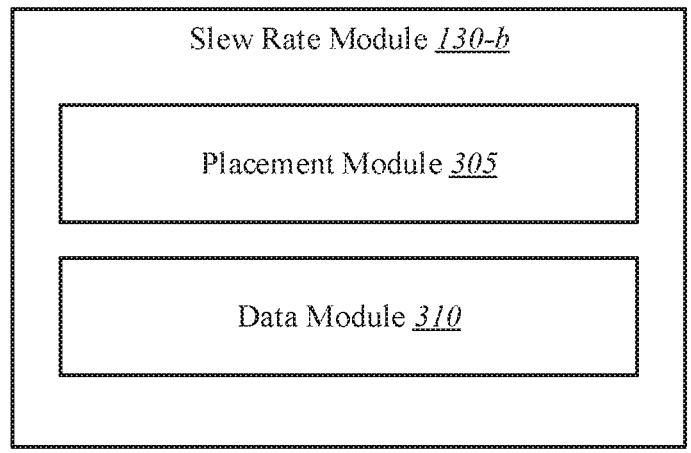
FIG. 3 shows a block diagram of one or more modules in accordance with various aspects of this disclosure.

FIG. 3 shows a block diagram of slew rate module 130-b. The slew rate module 130-b may include one or more processors, memory, and/or one or more storage devices. The slew rate module 130-b may include placement module 305 and data module 310. The slew rate module 130-b may be one example of slew rate module 130 of FIGS. 1 and/or 2. Each of these components may be in communication with each other.

In one embodiment, placement module 305 may be configured to place one or more comparator circuits connectively between one or more channel controllers and a one or more flash memory dies. In some cases, a hardware controller of a storage drive may include the one or more channel controllers. In some cases, the storage drive may include a solid state drive.

In some embodiments, data module 310 may be configured to maintain a slew rate in relation to one or more channel controllers writing data to one or more flash memory dies of a solid state drive. In some cases, the one or more comparator circuits may include at least one of an inverting comparator, a non-inverting comparator, and a differential amplifier, or any combination thereof. In one embodiment, the one or more comparator circuits may include at least one Schmitt trigger. In some cases, the one or more flash memory dies may include at least one NAND die.

In some embodiments, data module 310, in conjunction with a first channel controller, may be configured to drive data to and/or load data on a first set of flash memory dies from the one or more flash memory dies.

In some embodiments, data module 310, in conjunction with a first channel controller, may be configured to drive data to and/or load data on a second set of flash memory dies from the one or more flash memory dies. In some cases, the first set of flash memory dies or the second set of flash memory dies, or both, may include at least 32 flash memory dies. In some cases, the first set of flash memory dies or the second set of flash memory dies, or both, may include 16 flash memory dies, 32 flash memory dies, 48 flash memory dies, 64 flash memory dies, 128 flash memory dies, etc. As one example, data module 310 may be configured to maintain a slew rate in relation to one or more channel controllers writing data to 16, 32, 48, 64, or 128 flash memory dies flash memory dies of a solid state drive. In some cases, the output of the at least one comparator circuit may enable a connected channel controller to provide one or more flash memory dies a data signal with a slew rate of at least 0.3 volts per nanosecond.

In some cases, the output of the first comparator circuit may be connected to a receiver of a first memory die from the one or more flash memory dies. In one embodiment, a comparator circuit may include one or more electrical contact inputs and one or more electrical contact outputs. In some cases, an electrical contact input of a comparator circuit may electrically connect to an electrical contact output of a channel controller. In some cases, an electrical contact output of a comparator circuit may electrically connect an electrical contact input of at least one flash memory die.

In some cases, a distance of an electrical connection between the at least one comparator circuit and one or more flash memory dies may be relatively shorter than a distance of an electrical connection between the at least one comparator circuit and an associated channel controller.

In some embodiments, a channel controller may electrically connect to one or more write channels and/or one or more read channels. In some cases, each write channel may include one or more flash memory dies. In some cases, each read channel may include one or more flash memory dies. In some embodiments, one or more flash memory dies are associated with both a write channel and a read channel. In some cases, an electrical connection of a write channel may be routed on a printed circuit board between a channel controller and one or more flash memory dies to enable the channel controller to write data to the one or more flash memory dies. In some cases, an electrical connection of a read channel may be routed on a printed circuit board between a channel controller and one or more flash memory dies to enable the channel controller to read data from the one or more flash memory dies. In one embodiment, each flash memory die of a write channel may electrically connect to one or more comparator circuits. In one example, one or more comparator circuits may connect electrically between each flash memory die of a write channel and the channel controller of that write channel. In some embodiments, each flash memory die of a read channel may connect directly to a channel controller with no comparator circuit in between the flash memory die of the read channel and the channel controller of that read channel.

In some cases, a channel controller may electrically connect to one or more bidirectional channels. In one example, a bidirectional channel may include one or more write channels and one or more read channels, where an electrical connection between flash memory dies and a channel controller may be used for reads and/or writes of the bidirectional channel. In some cases, one or more comparator circuits may electrically connect between a channel controller and a flash memory die of a bidirectional channel.

In one embodiment, a first write channel may be routed between a first channel controller and a first set of flash memory dies. In some cases, a second write channel may be routed between a second channel controller and a second set of flash memory dies. In one embodiment, the first write channel and the second write channel may each include one or more data lines or conductive traces routed on a printed circuit board. In some examples, each data line of the first write channel and each data line of the second write channel may be electrically connected to at least one of the one or more comparator circuits.

Figure 4:
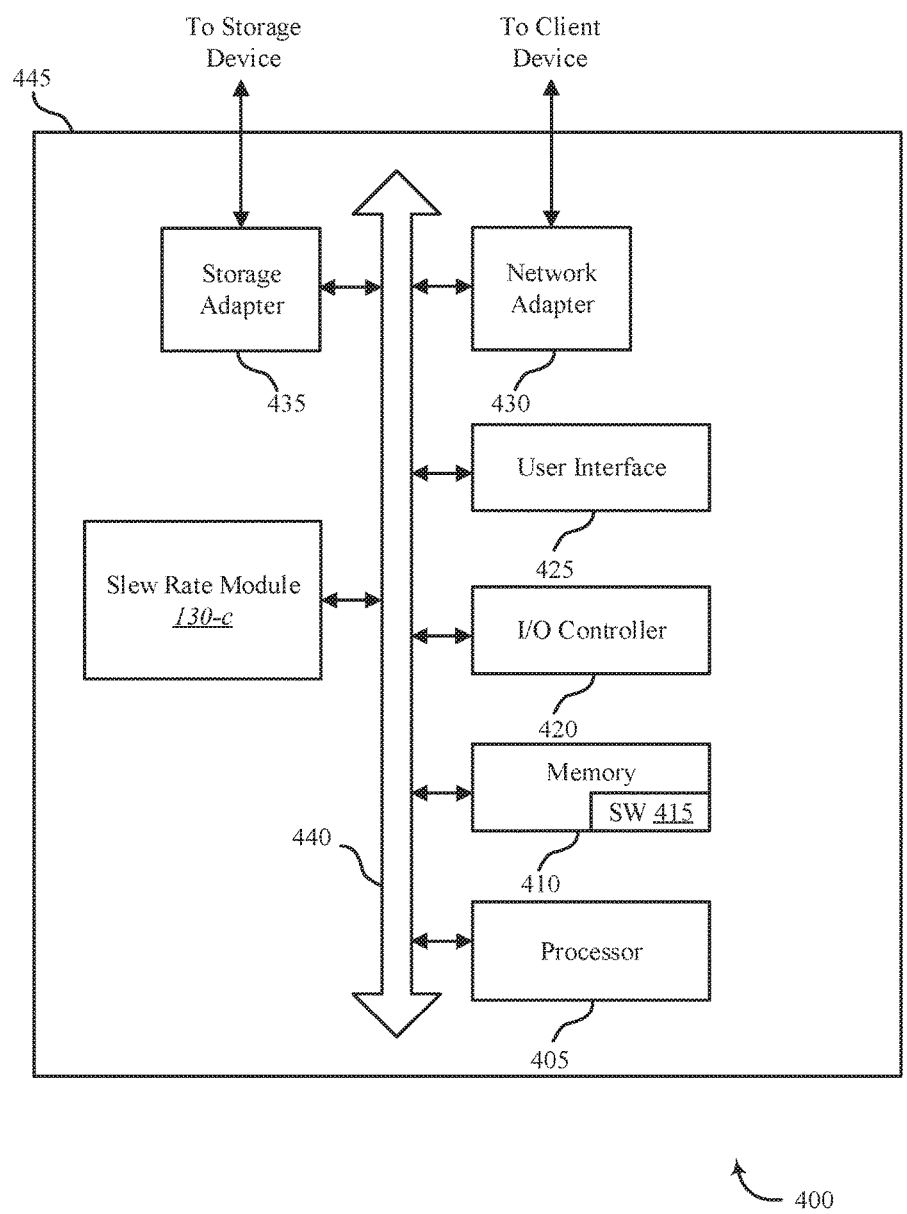
FIG. 4 shows a diagram of a system in accordance with various aspects of this disclosure.

FIG. 4 shows a system 400 for maintaining a slew rate while loading flash memory dies, in accordance with various examples. System 400 may include an apparatus 445, which may be an example of any one of device 105 of FIG. 1 and/or apparatus 205 of FIG. 2.

Apparatus 445 may include components for bi-directional voice and data communications including components for transmitting communications and components for receiving communications. For example, apparatus 445 may communicate bi-directionally with one or more storage devices and/or client systems. This bi-directional communication may be direct (apparatus 445 communicating directly with a storage system, for example) and/or indirect (apparatus 445 communicating indirectly with a client device through a server, for example).

Apparatus 445 may also include a processor module 405, a memory 410 (including software/firmware code (SW) 415), an input/output controller module 420, a user interface module 425, a network adapter 430, and a storage adapter 435. The software/firmware code 415 may be one example of a software application executing on apparatus 445. The network adapter 430 may communicate bi-directionally, via one or more wired links and/or wireless links, with one or more networks and/or client devices. In some embodiments, network adapter 430 may provide a direct connection to a client device via a direct network link to the Internet via a POP (point of presence). In some embodiments, network adapter 430 of apparatus 445 may provide a connection using wireless techniques, including digital cellular telephone connection, Cellular Digital Packet Data (CDPD)

connection, digital satellite data connection, and/or another connection. The apparatus 445 may include slew rate module 130-c, which may perform the functions described above for the slew rate module 130 of FIGS. 1, 2, and/or 3.

The signals associated with system 400 may include wireless communication signals such as radio frequency, electromagnetics, local area network (LAN), wide area network (WAN), virtual private network (VPN), wireless network (using 802.11, for example), cellular network (using 3G and/or LTE, for example), and/or other signals. The network adapter 430 may enable one or more of WWAN (GSM, CDMA, and WCDMA), WLAN (including BLUETOOTH® and Wi-Fi), WMAN (WiMAX) for mobile communications, antennas for Wireless Personal Area Network (WPAN) applications (including RFID and UWB), or any combination thereof.

One or more buses 440 may allow data communication between one or more elements of apparatus 445 such as processor module 405, memory 410, I/O controller module 420, user interface module 425, network adapter 430, and storage adapter 435, or any combination thereof.

The memory 410 may include random access memory (RAM), read only memory (ROM), flash memory, and/or other types. The memory 410 may store computer-readable, computer-executable software/firmware code 415 including instructions that, when executed, cause the processor module 405 to perform various functions described in this disclosure. Alternatively, the software/firmware code 415 may not be directly executable by the processor module 405 but may cause a computer (when compiled and executed, for example) to perform functions described herein. Alternatively, the computer-readable, computer-executable software/firmware code 415 may not be directly executable by the processor module 405, but may be configured to cause a computer, when compiled and executed, to perform functions described herein. The processor module 405 may include an intelligent hardware device, for example, a central processing unit (CPU), a microcontroller, an application-specific integrated circuit (ASIC), field programmable gate array (FPGA), or any combination thereof.

In some embodiments, the memory 410 may contain, among other things, the Basic Input-Output system (BIOS) which may control basic hardware and/or software operation such as the interaction with peripheral components or devices. For example, at least a portion of the slew rate module 130-c to implement the present systems and methods may be stored within the system memory 410. Applications resident with system 400 are generally stored on and accessed via a non-transitory computer readable medium, such as a hard disk drive or other storage medium. Additionally, applications can be in the form of electronic signals modulated in accordance with the application and data communication technology when accessed via a network interface such as network adapter 430.

Many other devices and/or subsystems may be connected to and/or included as one or more elements of system 400 (for example, a personal computing device, mobile computing device, smart phone, server, internet-connected device, cell radio module, or any combination thereof). In some embodiments, all of the elements shown in FIG. 4 need not be present to practice the present systems and methods. The devices and subsystems can be interconnected in different ways from that shown in FIG. 4. In some embodiments, an aspect of some operation of a system, such as that shown in FIG. 4, may be readily known in the art and are not discussed in detail in this application. Code to implement the present disclosure can be stored in a non-transitory computer-readable medium such as one or more of system memory 410 or other memory. The operating system provided on I/O controller module 420 may be a mobile device operation system, a desktop/laptop operating system, or another known operating system.

The I/O controller module 420 may operate in conjunction with network adapter 430 and/or storage adapter 435. The network adapter 430 may enable apparatus 445 with the ability to communicate with client devices such as device 105 of FIG. 1, and/or other devices over a communication network. Network adapter 430 may provide wired and/or wireless network connections. In some cases, network adapter 430 may include an Ethernet adapter or Fibre Channel adapter. Storage adapter 435 may enable apparatus 445 to access one or more data storage devices such as storage media 110. The one or more data storage devices may include two or more data tiers each. The storage adapter 445 may include one or more of an Ethernet adapter, a Fibre Channel adapter, Fibre Channel Protocol (FCP) adapter, a SCSI adapter, and iSCSI protocol adapter.

Figure 5:
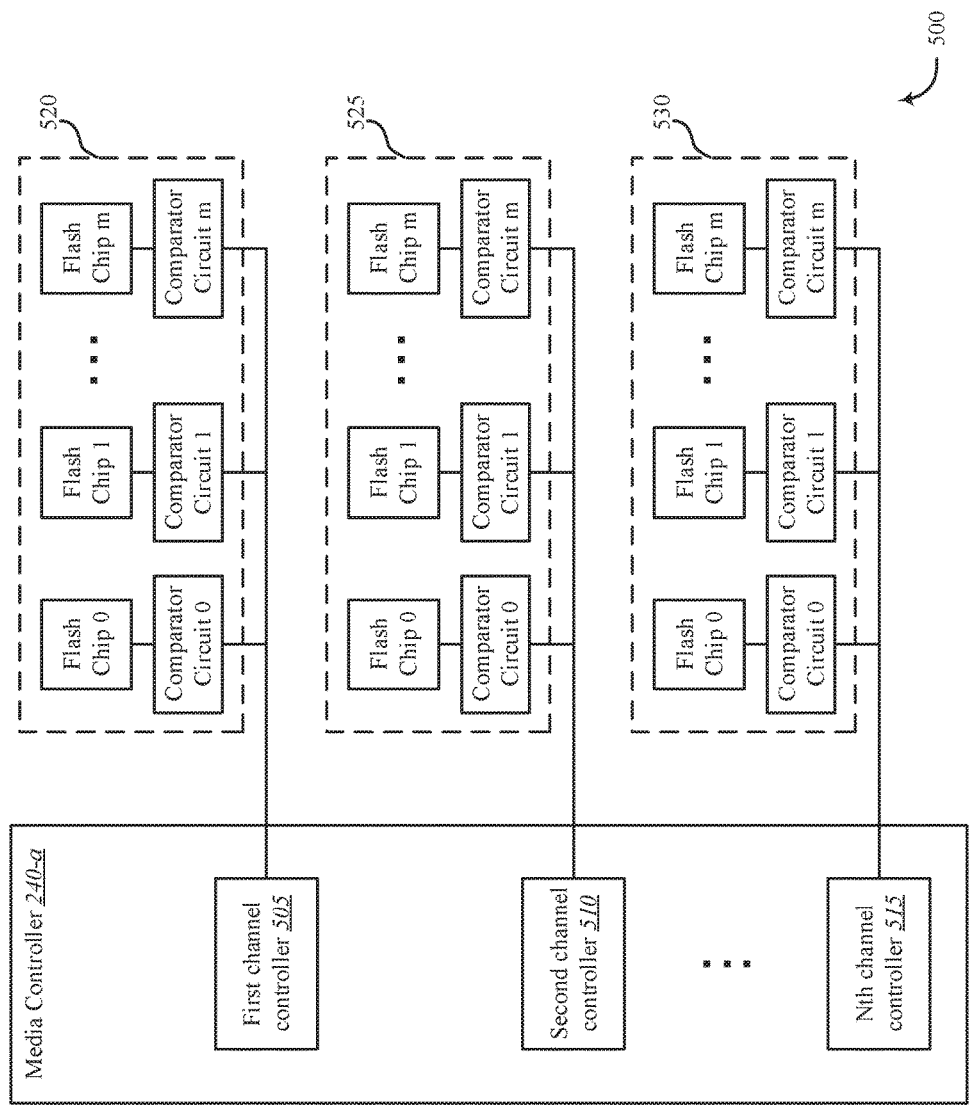
FIG. 5 shows one embodiment of an environment in accordance with various aspects of this disclosure.

FIG. 5 shows an environment 500 for maintaining a slew rate while loading flash memory dies, in accordance with various examples. At least one aspect of environment 500 may be implemented in conjunction with device 105 of FIG. 1, apparatus 205 of FIG. 2, and/or slew rate module 130 depicted in FIGS. 1, 2, 3, and/or 4. Media controller 240-a may be one example of media controller 240 of FIG. 2. In some embodiments, media controller 240-a may be inside or part of a hardware controller such as drive controller 210 of FIG. 2.

As depicted, environment 500 may include a media controller 240-a. In some embodiments, media controller 240-a may include first channel controller 505, second channel controller 510, and third channel controller 515. As shown, first channel controller 505 may connect electrically to first channel 520, second channel controller 510 may connect electrically to second channel 525, and nth channel controller 515 may connect electrically to nth channel 530. In some embodiments, each respective channel 520, 525, and 530 may include one or more flash chips.

As depicted, each channel 520, 525, and 530 may include m flash chips and m comparator circuits. In some cases, each flash chip may include one or more flash memory dies. For example, flash chip 0 of channel 520 may include one or more flash memory dies, flash chip 1 of channel 520 may include one or more flash memory dies, and so on. In some cases, the memory dies of the illustrated flash chips may include NAND dies. Although each channel 520, 525, and 530 is illustrated as a collection of m flash chips, in some embodiments each channel may include m flash memory dies, where m is an integer of 1 or more.

As depicted, each comparator circuit of each respective channel may be placed on a printed circuit board relatively close to an associated flash chip. For example, each comparator circuit may be placed closer to its respective flash chip than to its respective channel controller. In some cases, a comparator circuit may be placed on a printed circuit board as near as possible to a location of a flash chip on the same printed circuit board. For example, a comparator circuit may be placed adjacent to an associated flash chip up to a closest allowed or closest possible distance between the comparator circuit and the flash chip as determined based at least in part on predetermined PCB component placement constraints and/or predetermined PCB routing constraints. In some cases, an output of the comparator circuit may be placed at a closest allowed or closest possible distance to an input of an associated flash chip based at least in part on predetermined PCB component placement constraints and/or predetermined PCB routing constraints. In some cases, the packaging of a flash chip may include at least one of thin small outline package (TSOP), small-outline integrated circuit (SOIC), plastic small-outline package (PSOP), shrink small-outline package (SSOP), thin-shrink small outline package (TSSOP), and so on. In one embodiment, one or more comparator circuits may be included within the packaging of a flash chip. For example, a flash chip may be configured to include one or more flash memory dies and one or more comparator circuits within the same TSOP.

As illustrated, comparator circuit 0 of first channel 520 may be placed relatively closer to flash chip 0 of first channel 520 than to first channel controller 505, comparator circuit 1 of first channel 520 may be placed relatively closer to flash chip 1 of first channel 520 than to first channel controller 505, and so forth. Similarly, comparator circuit 0 of second channel 525 may be placed relatively closer to flash chip 0 of second channel 525 than to second channel controller 510, comparator circuit 1 of second channel 525 may be placed relatively closer to flash chip 1 of second channel 525 than to second channel controller 510, and so on. Although FIG. 5 depicts a single conductive line extending from each channel controller 505, 510, and 515 to one or more comparator circuits, in some cases a bus of two or more conductive lines may be routed on a printed circuit board between each depicted channel controller and the respective set of comparator circuits. For example, a bus may run between first channel controller 505 and comparator circuit 0, comparator circuit 1, up to comparator circuit m. In some cases, at least one comparator circuit may be electrically connected to each data line of the bus. In some cases, the conductive line running from the channel controllers 505, 510, and 515 may include a serial data line.

In one embodiment, channel controllers 505, 510, and/or 515 may be configured with one or more drivers configured to drive data on or to a particular channel. For example, first channel controller 505 may include one or more drivers configured to drive data to one or more flash chips of first channel 520, second channel controller 510 may include one or more drivers configured to drive data to one or more flash chips of second channel 525, and so on. In some embodiments, each flash chip includes one or more receivers configured to receive the data driven by the drivers of first channel controller 505. In some embodiments, each receiver is configured to receive the data at a minimum slew rate. When the slew rate drops below a predetermined minimum slew rate, the data received by the flash chips may get corrupted as the receiver may not properly decipher the incoming data. In some cases, the comparator circuits of each respective channel may receive the data from the respective channel controllers and maintain a slew rate while loading data onto the flash chips. For example, a driver inside first channel controller 505 may drive data to flash chip 1 inside first channel 520. Comparator circuit 1 of first channel 520 may receive the data and provide the data to flash chip 1 while maintaining a minimum slew rate of a receiver of flash chip 1.

Figure 6:
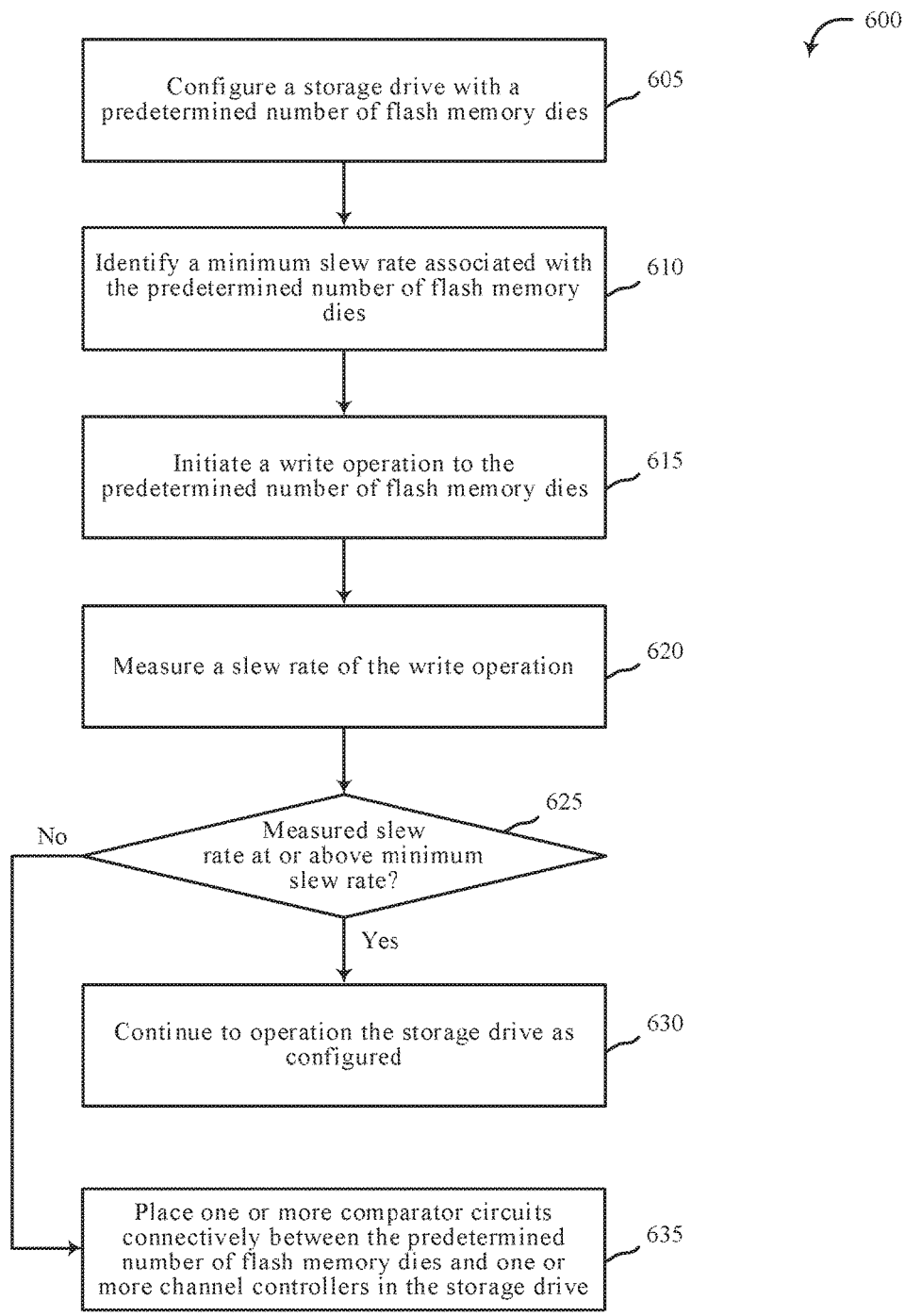
FIG. 6 is a flow chart illustrating an example of a method in accordance with various aspects of this disclosure.

FIG. 6 is a flow chart illustrating an example of a method 600 for maintaining a slew rate while loading flash memory dies, in accordance with various aspects of the present disclosure. One or more aspects of the method 600 may be implemented in conjunction with device 105 of FIG. 1, apparatus 205 of FIG. 2, and/or slew rate module 130 depicted in FIGS. 1, 2, 3, and/or 4. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 605, method 600 may include configuring a storage drive having a predetermined number of flash memory dies. At block 610, method 600 may include identifying a minimum slew rate associated with the predetermined number of flash memory dies. At block 615, method 600 may include initiating a write operation to the predetermined number of flash memory dies. At block 620, method 600 may include measuring a slew rate of the write operation.

At block 625, method 600 may include determining whether the measured slew rate is at or above the identified minimum slew rate. Upon determining the measured slew rate is not at or above the identified minimum slew rate, at block 630, method 600 may include continuing to operation the storage drive as configured. Upon determining the measured slew rate is not at or above the identified minimum slew rate, at block 635, method 600 may include placing one or more comparator circuits connectively between the predetermined number of flash memory dies and one or more channel controllers in the storage drive.

The operation(s) at block 605-635 may be performed using the slew rate module 130 described with reference to FIGS. 1-4 and/or another module. Thus, the method 600 may provide for maintaining a slew rate while loading flash memory dies. It should be noted that the method 600 is just one implementation and that the operations of the method 600 may be rearranged, omitted, and/or otherwise modified such that other implementations are possible and contemplated.

In some examples, aspects from two or more of the method 600 may be combined and/or separated. It should be noted that the method 600 is just one example implementation, and that the operations of method 600 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and/or microwave are included in the definition of medium. Disk and disc, as used herein, include any combination of compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A storage system comprising:
 a storage drive, the storage drive comprising:
  a hardware controller comprising one or more channel controllers;

a plurality of flash memory dies;
one or more comparator circuits to maintain a slew rate in relation to the one or more channel controllers writing data to the plurality of flash memory dies, the one or more comparator circuits being placed connectively between the one or more channel controllers and the plurality of flash memory dies.

2. The storage system of claim 1, wherein the one or more channel controllers comprises:
a first channel controller to drive a first set of flash memory dies from the plurality of flash memory dies; and
a second channel controller to drive a second set of flash memory dies from the plurality of flash memory dies.

3. The storage system of claim 2, wherein the first set of flash memory dies or the second set of flash memory dies, or both, include at least 32 flash memory dies.

4. The storage system of claim 2, wherein an input of at least one of the one or more comparator circuits electrically connects to the first channel controller and an output of the at least one comparator circuit electrically connects to the first set of flash memory dies.

5. The storage system of claim 4, wherein a distance of an electrical connection between the at least one comparator circuit and the first set of flash memory dies is relatively shorter than a distance of an electrical connection between the at least one comparator circuit and the first channel controller.

6. The storage system of claim 4, wherein the output of the at least one comparator circuit enables the first channel controller to provide the first set of flash memory dies a data signal with a slew rate of at least 0.3 volts per nanosecond.

7. The storage system of claim 2, wherein a first write channel is routed between the first channel controller and the first set of flash memory dies to enable the first channel controller to write data to the first set of flash memory dies, and wherein a first read channel is routed between the first channel controller and the first set of flash memory dies to enable the first channel controller to read data from the first set of flash memory dies, wherein the first read channel is separate from the first write channel.

8. The storage system of claim 7, wherein a second write channel is routed between the second channel controller and the second set of flash memory dies, wherein the first write channel and the second write channel each include one or more data lines, and wherein each data line of the first write channel and each data line of the second write channel is electrically connected to at least one of the one or more comparator circuits.

9. The storage system of claim 1, wherein the one or more comparator circuits include at least one of an inverting comparator, a non-inverting comparator, and a differential amplifier, or any combination thereof.

10. The storage system of claim 1, wherein the plurality of flash memory dies include at least one NAND die.

11. An apparatus comprising:
a hardware controller comprising one or more channel controllers;
a plurality of flash memory dies;
one or more comparator circuits to maintain a slew rate in relation to the one or more channel controllers writing data to the plurality of flash memory dies, the one or more comparator circuits being placed connectively between the one or more channel controllers and the plurality of flash memory dies.

12. The apparatus of claim 11, comprising:
a first channel controller to drive a first set of flash memory dies from the plurality of flash memory dies; and
a second channel controller to drive a second set of flash memory dies from the plurality of flash memory dies.

13. The apparatus of claim 12, wherein the first set of flash memory dies or the second set of flash memory dies, or both, include at least 32 flash memory dies.

14. The apparatus of claim 12, wherein an input of at least one of the one or more comparator circuits electrically connects to the first channel controller and an output of the at least one comparator circuit electrically connects to the first set of flash memory dies.

15. The apparatus of claim 14, wherein a distance of an electrical connection between the at least one comparator circuit and the first set of flash memory dies is relatively shorter than a distance of an electrical connection between the at least one comparator circuit and the first channel controller.

16. The apparatus of claim 14, wherein the output of the at least one comparator circuit enables the first channel controller to provide the first set of flash memory dies a data signal with a slew rate of at least 0.3 volts per nanosecond.

17. The apparatus of claim 12, wherein a first write channel is routed between the first channel controller and the first set of flash memory dies to enable the first channel controller to write data to the first set of flash memory dies, and wherein a first read channel is routed between the first channel controller and the first set of flash memory dies to enable the first channel controller to read data from the first set of flash memory dies, wherein the first read channel is separate from the first write channel.

18. The apparatus of claim 17, wherein a second write channel is routed between the second channel controller and the second set of flash memory dies, wherein the first write channel and the second write channel each include one or more data lines, and wherein each data line of the first write channel and each data line of the second write channel is electrically connected to at least one of the one or more comparator circuits.

19. A method comprising:
placing one or more comparator circuits connectively between one or more channel controllers and a plurality of flash memory dies, a hardware controller of a solid state drive including the one or more channel controllers; and
maintaining a slew rate in relation to the one or more channel controllers writing data to a plurality of flash memory dies inside the solid state drive, the plurality of flash memory dies including at least one NAND die.

20. The method of claim 19, comprising:
using a first channel controller to drive a first set of flash memory dies from the plurality of flash memory dies; and
using a second channel controller to drive a second set of flash memory dies from the plurality of flash memory dies, wherein the first set of flash memory dies or the second set of flash memory dies, or both, include at least 32 flash memory dies.

* * * * *